United States Patent
Chen et al.

(10) Patent No.: US 7,974,324 B2
(45) Date of Patent: Jul. 5, 2011

(54) SURFACE-EMITTING LASER DEVICE

(75) Inventors: Shih-Wei Chen, Zhubei (TW);
Tien-Chang Lu, Pingzhen (TW);
Hao-Chung Kuo, Yonghe (TW);
Shing-Chung Wang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/708,665

(22) Filed: Feb. 19, 2010

(65) Prior Publication Data
US 2011/0044365 A1 Feb. 24, 2011

(30) Foreign Application Priority Data
Aug. 21, 2009 (TW) ................ 98128338 A (51) Int. Cl.
*H01S 5/00* (2006.01)
(52) U.S. Cl. .............. 372/45.012; 372/50.124
(58) Field of Classification Search .......... 349/105; 257/25; 372/45.01, 45.012, 50.124
See application file for complete search history.

(56) References Cited

U.S. PATENT DOCUMENTS

| | | | | |
|---|---|---|---|---|
| 5,955,749 A | * | 9/1999 | Joannopoulos et al. | 257/98 |
| 6,778,581 B1 | * | 8/2004 | Lipson | 372/96 |
| 6,810,056 B1 | * | 10/2004 | Lipson et al. | 372/46.01 |
| 2004/0091010 A1 | * | 5/2004 | Choquette et al. | 372/44 |

* cited by examiner

*Primary Examiner* — Minsun Harvey
*Assistant Examiner* — Tuan N. Nguyen
(74) *Attorney, Agent, or Firm* — Osha • Liang LLP (57) ABSTRACT

A surface-emitting laser device includes: a substrate; a low refractive index layer with a refractive index $n_L$ and disposed on the substrate; a light emitting layered structure with a refractive index $n_H$, where $n_H > n_L$, the light emitting layered structure being formed on the low refractive index layer and having first and second semiconductor layers and a multi-quantum well (MQW) disposed between the first and second semiconductor layers and capable of generating photons having a wavelength $\lambda_0$; and a two-dimensional photonic crystal (2DPC) formed in the light emitting layered structure and having optical nanostructures arranged into a periodic pattern with a lattice constant a. The nanostructures extend from the first semiconductor layer through the MQW. The 2DPC has a normalized frequency, which is defined as $a/\lambda_0$, ranging from 0.25 to 0.70.

8 Claims, 9 Drawing Sheets

SURFACE-EMITTING LASER DEVICE

CROSS-REFERENCE TO RELATED APPLICATION

This application claims priority of Taiwanese application no. 098128338, filed on Aug. 21, 2009.

BACKGROUND OF THE INVENTION

1. Field of the Invention

This invention relates to a surface-emitting laser (SEL) device, more particularly to a surface-emitting laser (SEL) device including a two-dimensional photonic crystal (2DPC) having optical nanostructures extending through a multi-quantum well (MQW) and a normalized frequency ranging from 0.25 to 0.7.

2. Description of the Related Art

A conventional vertical cavity surface-emitting laser (VCSEL) device includes an active region, which is capable of generating photons therein, and a pair of distributed Bragg reflectors (DBRs) sandwiching the active region therebetween so as to permit the photons to resonate between the upper and lower DBRs such that the photons can be stimulated to gain sufficient power in order to be able to be emitted to the outside along the vertical direction. However, each of the DBRs is composed of a plurality of alternately disposed high and low refractive index layers, which can cause the conventional VCSEL to emit a laser light with multiple transverse modes, which, in turn, can result in a decrease in the output power of the conventional VCSEL.

Figure 1:
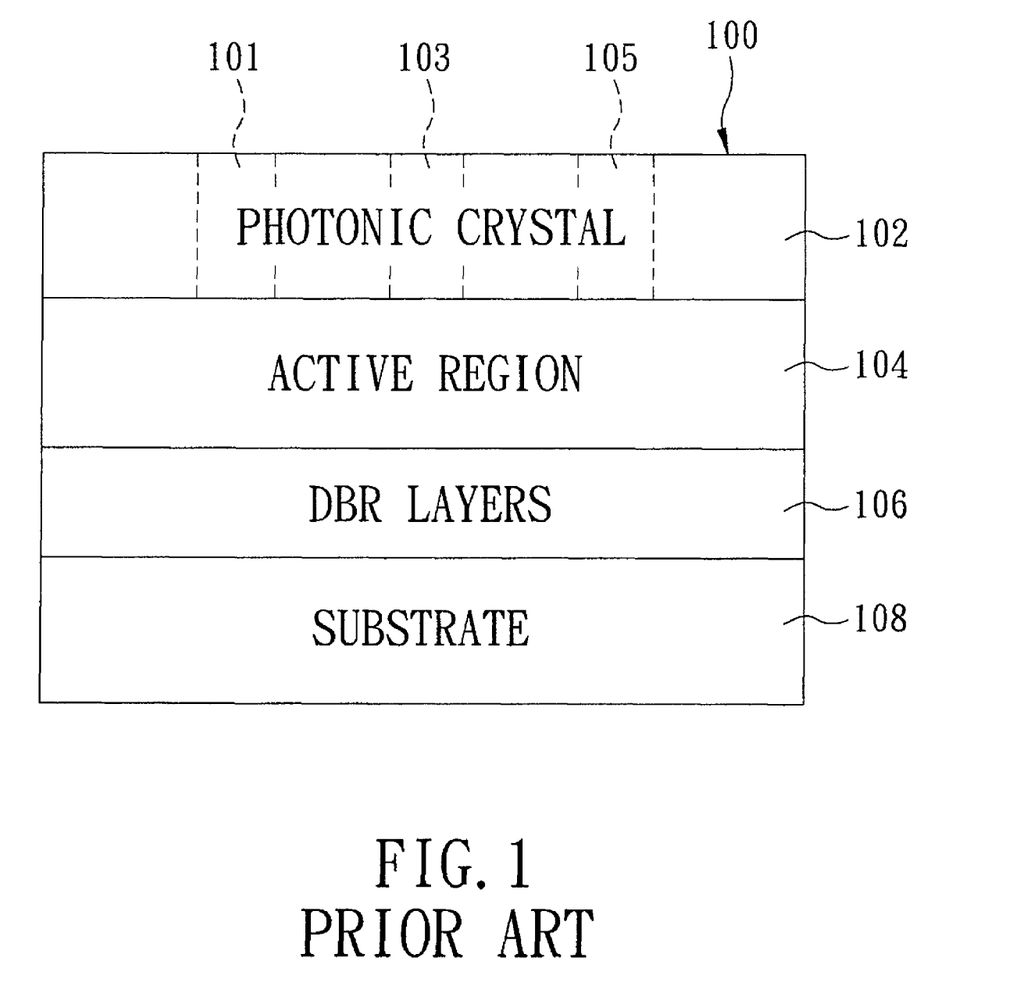
FIG. 1 is a schematic diagram to illustrate the structure of a conventional high power single mode VCSEL disclosed in U.S. Pat. No. 6,704,343 B2.

Referring to FIG. 1, U.S. Pat. No. 6,704,343 B2 discloses a conventional high power single mode vertical cavity surface-emitting laser (VCSEL) device 100 including a substrate 108, a plurality of DBR layers 106 formed on the substrate 108, an active region 104 formed on the DBR layers 106 for generating photons, and a two-dimensional photonic crystal (2DPC) 102 formed on the active region 104 and having a cavity structure composed of cavities 101, 103, and 105. The two-dimensional photonic crystal (2DPC) 102 is effective to reflect the photons having a specific wavelength and moving in the vertical direction. As a consequence, the photons with the specific wavelength can be resonated between the 2DPC 102 and the DBR layers 106 so as to gain sufficient power to generate a high power laser light with a single mode, i.e., a single wavelength. Although the VCSEL 100 can emit high power laser light, formation of a large number of the DBR layers 106 can result in a considerable increase in the manufacturing costs and time.

SUMMARY OF THE INVENTION

Therefore, the object of the present invention is to provide a surface-emitting laser (SEL) device that can overcome the aforesaid drawback of the prior art.

According to this invention, there is provided a surface-emitting laser (SEL) device that comprises: a substrate; a low refractive index layer with a refractive index $n_L$ and disposed on the substrate; a light emitting layered structure with a refractive index $n_H$, where $n_H > n_L$, the light emitting layered structure being formed on the low refractive index layer and having first and second semiconductor layers and a multi-quantum well (MQW) disposed between the first and second semiconductor layers and capable of generating photons having a wavelength $\lambda_0$; and a two-dimensional photonic crystal (2DPC) formed in the light emitting layered structure and having optical nanostructures arranged into a periodic pattern with a lattice constant a. The nanostructures extend from the first semiconductor layer through the multi-quantum well (MQW). The two-dimensional photonic crystal (2DPC) has a normalized frequency, which is defined as $a/\lambda_0$, ranging from 0.25 to 0.70.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 2:
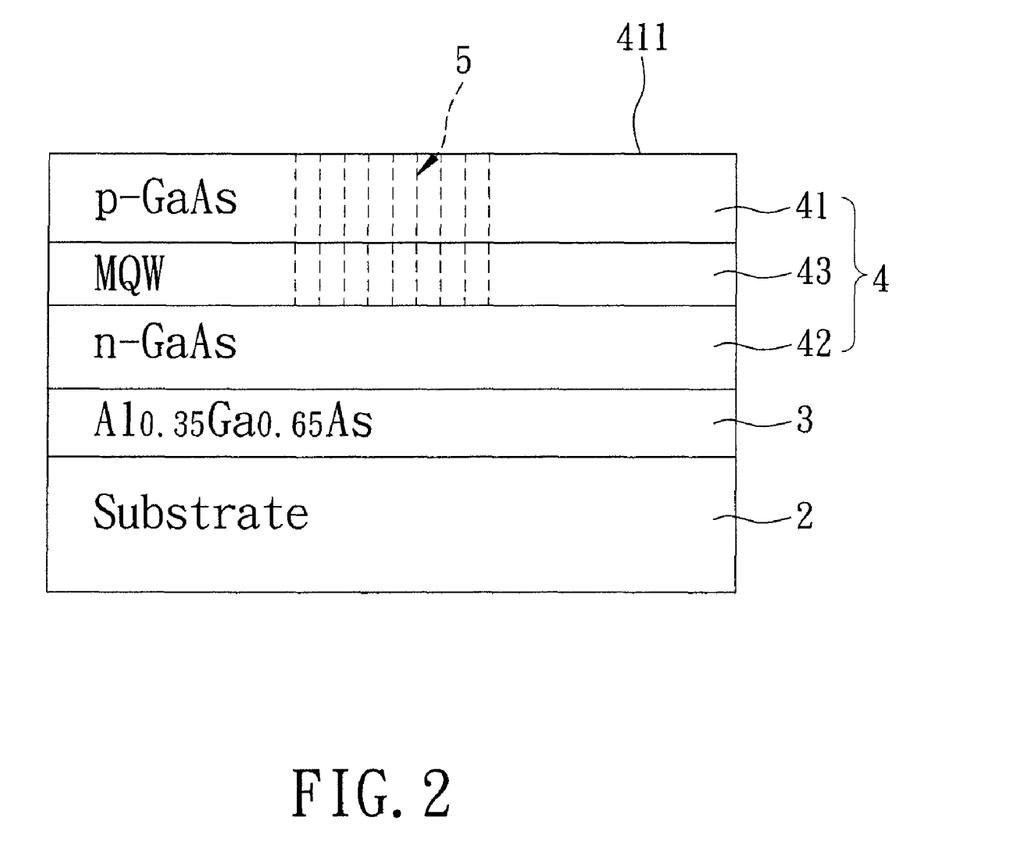
FIG. 2 is a schematic diagram of the first preferred embodiment of a surface-emitting laser device according to this invention.
Figure 4:
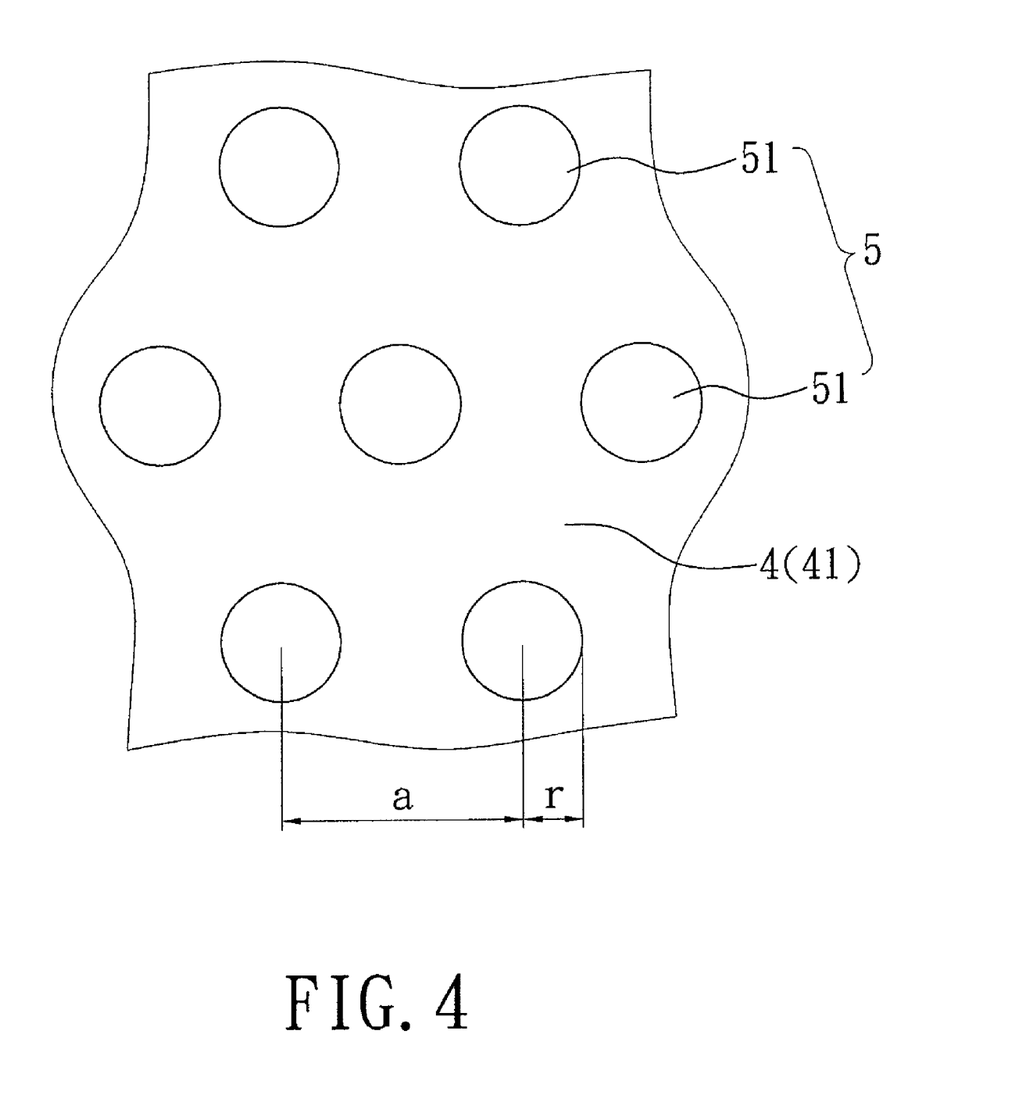
FIG. 4 is a schematic diagram of the two-dimensional photonic crystal (2DPC) of the first preferred embodiment to illustrate a honeycomb-shaped pattern of one lattice of the 2DPC.

Referring to FIG. 2, the first preferred embodiment of a surface-emitting laser (SEL) device according to the present invention is shown to include: a substrate 2; a low refractive index layer 3 with a refractive index $n_L$ and disposed on the substrate 2; a light emitting layered structure 4 with a refractive index $n_H$, where $n_H > n_L$, the light emitting layered structure 4 being formed on the low refractive index layer 3 and having first and second semiconductor layers 41, 42 and a multi-quantum well (MQW) 43 disposed between the first and second semiconductor layers 41, 42 and capable of generating photons having a wavelength $\lambda_0$; and a two-dimensional photonic crystal (2DPC) 5 formed in the light emitting layered structure and having optical nanostructures arranged into a periodic pattern with a lattice constant a (see FIG. 4). The nanostructures extend from the first semiconductor layer 41 through the multi-quantum well (MQW) 43. The two-dimensional photonic crystal (2DPC) 5 has a normalized frequency, which is defined as $a/\lambda_0$, preferably ranging from 0.25 to 0.70. In the first preferred embodiment of the present invention, photons generated from the light emitting layered structure 4 are confined in the light emitting layered structure 4 by the low refractive index layer 3 and the two-dimensional photonic crystal (2DPC) 5. In addition, the two-dimensional photonic crystal (2DPC) 5 enables the photons to be resonated therein and be stimulated to gain sufficient power so as to generate a laser light with a single mode, and to emit the laser light from a surface 411 of the first semiconductor layer 41 along a vertical direction relative to the light emitting layered structure 4 to the outside. When the normalized frequency of the two-dimensional photonic crystal (2DPC) 5 is lower than 0.25, the wave vector ($2\pi/\lambda_0$) of the photons resonated in the two-dimensional photonic crystal (2DPC) 5 is too low to comply with Bragg's law such that the photons cannot be stimulated to gain sufficient power to be emitted to the outside from the surface 411 of the first semiconductor layer 41 along the vertical direction. When the normalized frequency of the two-dimensional photonic crystal (2DPC) 5 is greater than 0.7, i.e., the number of the optical nanostructures for resonating the photons per unit area is reduced, the supply energy, i.e., a supply threshold voltage ($V_{th}$), for stimulating the photons to generate the desired laser light is required to be increased.

Preferably, the low refractive index layer 3 is made from a III-V compound, silicon oxide, silicon nitride, or indium tin oxide (ITO), and the light emitting layered structure 4 is made from the III-V compound.

In this embodiment, the light emitting layered structure 4 and the low refractive index layer 3 are made from a GaAs-based compound, and thus, the photons generated from the multi-quantum well (MQW) 43 ranges from 650 nm to 980 nm. Accordingly, the lattice constant a of the periodic pattern ranges from 200 nm to 600 nm.

Figure 3A:
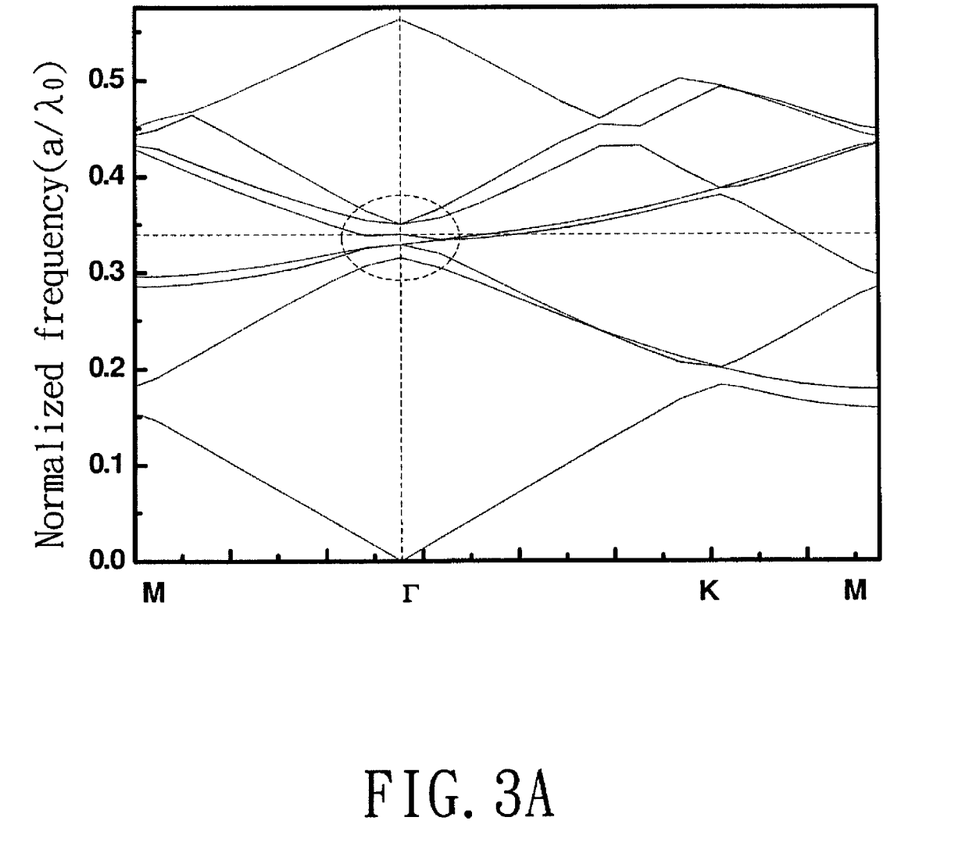
FIG. 3A is a photonic band diagram obtained using a plane-wave expansion method to illustrate a band structure of a two-dimensional photonic crystal (2DPC) of the first preferred embodiment.
Figure 3B:
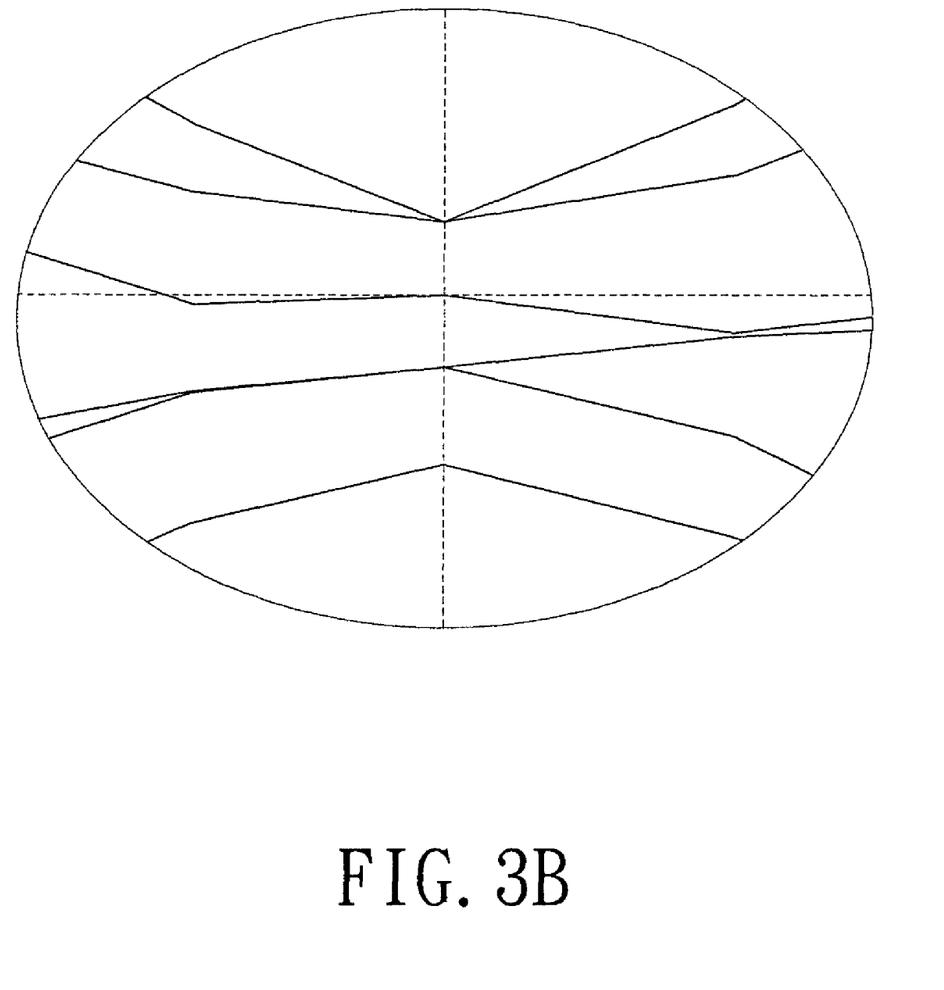
FIG. 3B is an enlarged view of an encircled portion in FIG. 3A.

FIGS. 3A and 3B illustrate the photonic band diagrams of a band structure of the two-dimensional photonic crystal (2DPC) 5 according to the first embodiment of the present invention. As shown in FIGS. 3A and 3B, points of the photonic band, which have a slope approximately equal to zero, are assumed to be points which might generate laser light. Since a lot of points having a slope of about 0 are gathered at a normalized frequency ($a/\lambda_0$) ranging from 0.3 to 0.4, the normalized frequency ($a/\lambda_0$) of the two-dimensional photonic crystal (2DPC) 5 of the first embodiment preferably ranges from 0.3 to 0.4. In addition, since, in Γ direction, a point at a normalized frequency of 0.34 has a slope of about 0, a normalized frequency of 0.34 is used as a factor to design the laser device in the following first example.

Preferably, the optical nanostructures of the two-dimensional photonic crystal (2DPC) 5 are in the form of circular nanocavities 51, which are arranged into a honeycomb-shaped pattern (see FIG. 4). Preferably, each of the circular nanocavities 51 has a radius r, where 0.11<r/a<0.45.

Preferably, formation of the low refractive index layer 3 on the substrate 2 is performed by epitaxial-growth techniques.

Based on the aforesaid photonic band diagrams of the first preferred embodiment, the first example of a surface-emitting laser device with a normalized frequency of 0.34 is designed.

In the first example, the low refractive index layer 3 is made from $Al_{0.35}Ga_{0.65}As$, the first semiconductor layer 41 is made from p-GaAs with a layer thickness of 650 nm, the second semiconductor layer 42 is made from n-GaAs with a layer thickness of 650 nm, and the multi-quantum well (MQW) 43 is made from the GaAs-based compound with a layer structure of $(In_{0.2}Ga_{0.8}As/GaAs)_{10}$ and a layer thickness of 100 nm, the material of which is capable of generating photons having the wavelength $\lambda_0$ of 980 nm. The radius r of each circular nanocavity 51 of the two-dimensional photonic crystal (2DPC) 5 is 90 nm, and the lattice constant a of the periodic pattern is 330 nm.

In addition, to determine the relationship between the thickness of the low refractive index layer 3 and the threshold voltage ($V_{th}$) for stimulating the photons to generate the desired laser light, the following experiments were conducted. The conditions for conducting the experiments and the results of the experiments are shown in Table 1.

In Table 1, confinement indicates a percentage of interaction between photons and the two-dimensional photonic crystal (2DPC). The higher the confinement, the larger the number of the photons that can be stimulated and the higher will be the gained power of the laser light, i.e., the supply threshold voltage ($V_{th}$) for stimulating the photons to generate the desired laser light is reduced. As shown in Table 1, when the layer thickness of the low refractive index layer 3 is increased from 10 nm to 200 nm, the confinement of the first example is increased from 51.8% to 61.4%, and thus, the supply threshold voltage ($V_{th}$) can be reduced.

TABLE 1

| $Al_{0.35}Ga_{0.65}As^5$ | | n-GaAs/MQW/p-GaAs[1] | | | | 2DPC[2] | | | | |
|---|---|---|---|---|---|---|---|---|---|---|
| | thickness | | thickness (nm) | | | r | a | | depth[3] | Conf.[4] |
| $n_L$ | (nm) | n | MQW | p | $n_H$ | (nm) | (nm) | r/a | (nm) | (%) |
| 3 | 10 | 650 | 100 | 650 | 3.5 | 90 | 330 | 0.273 | 750 | 51.82 |
| 3 | 20 | 650 | 100 | 650 | 3.5 | 90 | 330 | 0.273 | 750 | 55.07 |
| 3 | 30 | 650 | 100 | 650 | 3.5 | 90 | 330 | 0.273 | 750 | 57.64 |
| 3 | 40 | 650 | 100 | 650 | 3.5 | 90 | 330 | 0.273 | 750 | 57.82 |
| 3 | 50 | 650 | 100 | 650 | 3.5 | 90 | 330 | 0.273 | 750 | 58.84 |
| 3 | 100 | 650 | 100 | 650 | 3.5 | 90 | 330 | 0.273 | 750 | 60.79 |
| 3 | 200 | 650 | 100 | 650 | 3.5 | 90 | 330 | 0.273 | 750 | 61.38 |

[1] wavelength $\lambda_0$ of the light emitting layered structure is 980 nm.
[2] normalized frequency $a/\lambda_0$ of the 2DPC is about 0.34.
[3] depth of each circular nanocavity.
[4] confinement.
[5] low refractive index layer 3.

Figure 5:
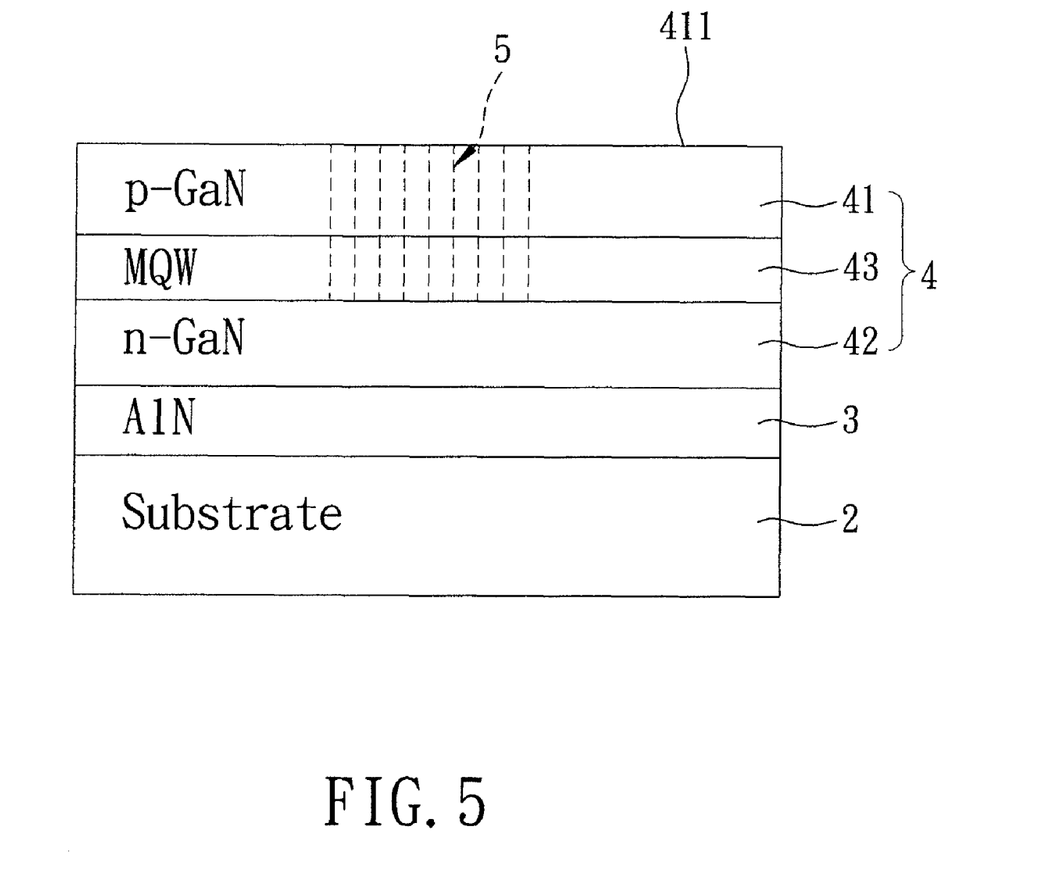
FIG. 5 is a schematic diagram of the second preferred embodiment of the surface-emitting laser (SEL) device according to this invention.

Referring to FIG. 5, the second preferred embodiment of the surface-emitting laser (SEL) device of this invention is similar to the first preferred embodiment, except that the light emitting layered structure 4 is made from a GaN-based compound. Accordingly, the lattice constant a of the periodic pattern preferably ranges from 190 nm to 300 nm.

Figure 6A:
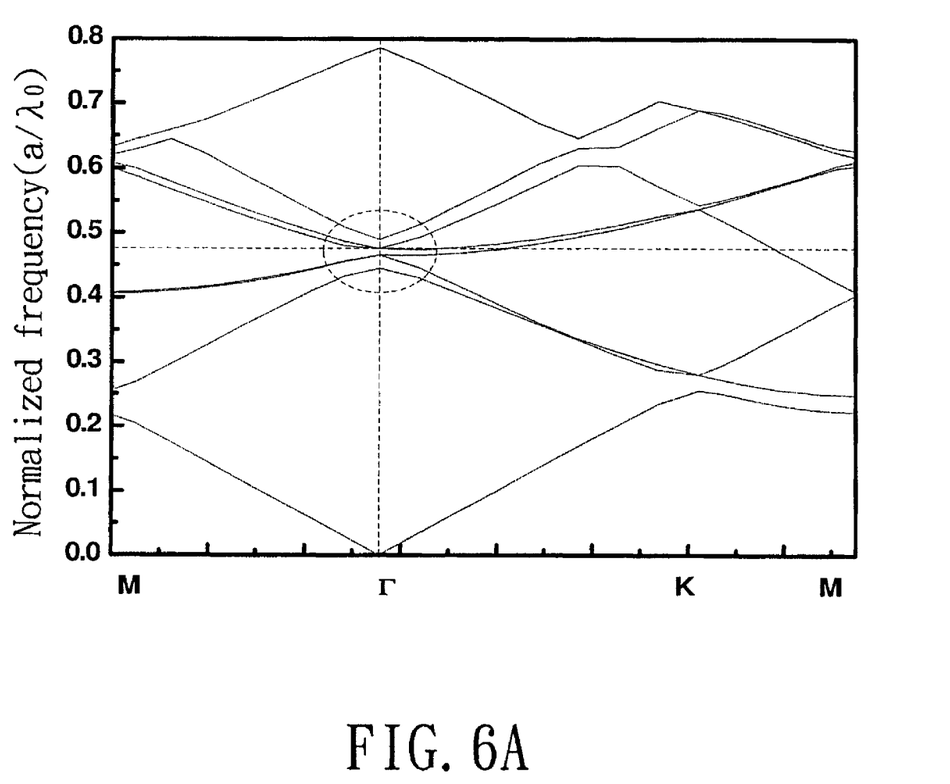
FIG. 6A is a photonic band diagram obtained using a plane-wave expansion method to illustrate a band structure of a two-dimensional photonic crystal (2DPC) of the second preferred embodiment.
Figure 6B:
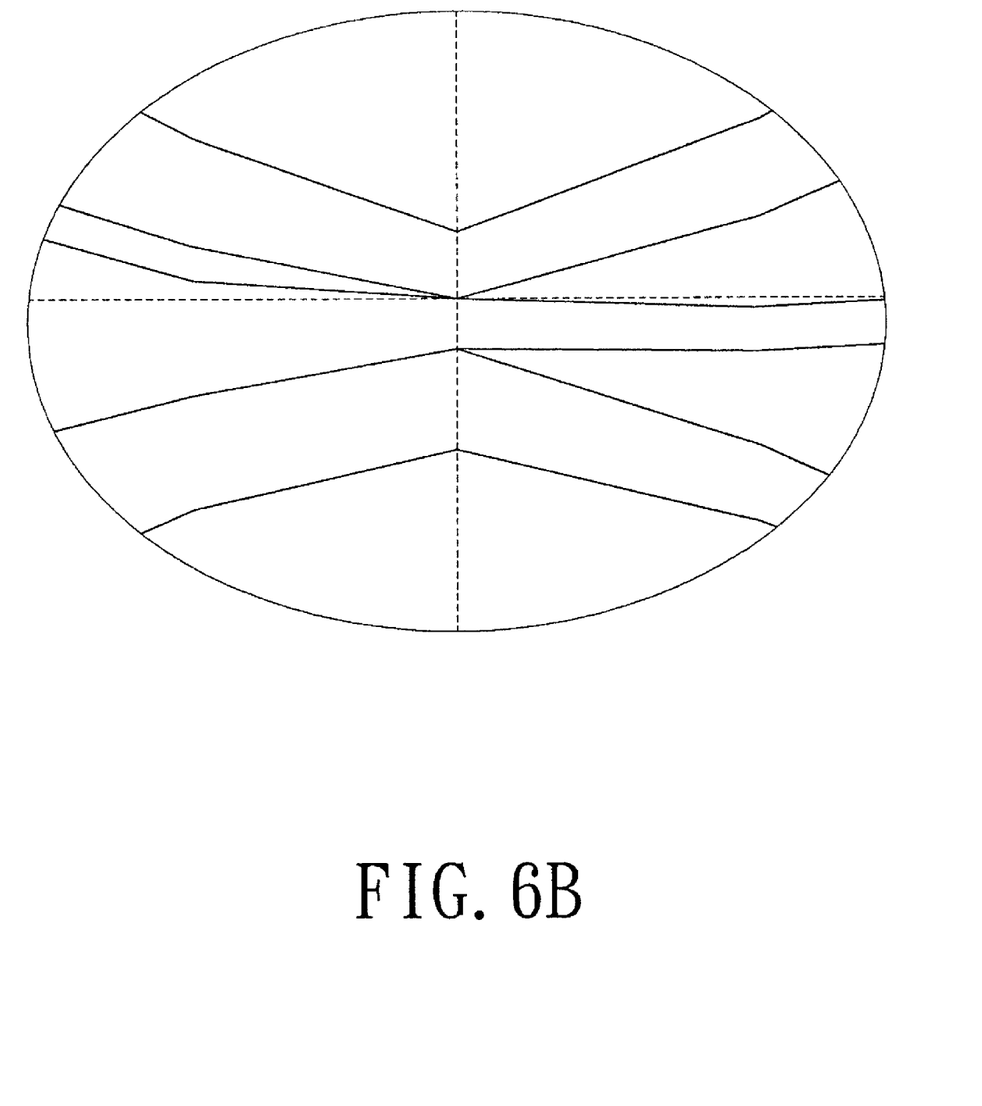
FIG. 6B is an enlarged view of an encircled portion in FIG. 6A.

As shown in FIGS. 6A and 6B, in Γ direction, since points having a slope of about 0 are gathered at a normalized frequency ($a/\lambda_0$) ranging from 0.4 to 0.5, a normalized frequency ($a/\lambda_0$) of the two-dimensional photonic crystal (2DPC) 5 of the second embodiment preferably ranges from 0.4 to 0.5. In addition, since, in Γ direction, a point at a normalized frequency of 0.47 has a slope of 0, a normalized frequency of 0.47 is used as a factor to design the laser device in the following second example.

In the second example, the low refractive index layer 3 is made from AlN, the first semiconductor layer 41 is made from p-GaN with a layer thickness of 200 nm, the second semiconductor layer 42 is made from n-GaN with a layer thickness of 240 nm, and the multi-quantum well (MQW) 43 is made from the GaN-based compound with a layer structure of $(In_{0.2}Ga_{0.8}N/GaN)_{10}$ and a layer thickness of 100 nm, the material of which is capable of generating photons having the wavelength $\lambda_0$ of 450 nm. The radius r of each circular nanocavity 51 of the two-dimensional photonic crystal (2DPC) 5 is 70 nm, and the lattice constant a of the periodic pattern is 210 nm.

The relationship between the thickness of the low refractive index layer 3 and the threshold voltage ($V_{th}$) for stimulating the photons to generate the desired laser light was also determined.

As shown in Table 2, the confinement of the second example is increased from 53.6% to 61.2% when the layer thickness of the low refractive index layer 3 is increased from 30 to 100 nm, and thus, the supply threshold voltage ($V_{th}$) can be reduced.

TABLE 2

| AlN[5] | | n-GaN/MQW/p-GaN[1] | | | | 2DPC[2] | | | | |
|---|---|---|---|---|---|---|---|---|---|---|
| | thickness | thickness (nm) | | | | r | a | | depth[3] | Conf.[4] |
| $n_L$ | (nm) | n | MQW | p | $n_H$ | (nm) | (nm) | r/a | (nm) | (%) |
| 2.1 | 30 | 240 | 100 | 200 | 2.5 | 70 | 210 | 0.333 | 300 | 53.65 |
| 2.1 | 40 | 240 | 100 | 200 | 2.5 | 70 | 210 | 0.333 | 300 | 56.27 |
| 2.1 | 50 | 240 | 100 | 200 | 2.5 | 70 | 210 | 0.333 | 300 | 58.02 |
| 2.1 | 100 | 240 | 100 | 200 | 2.5 | 70 | 210 | 0.333 | 300 | 61.17 |

[1]wavelength $\lambda_0$ of the light emitting layered structure is 450 nm.
[2]normalized frequency $a/\lambda_0$ of the 2DPC is about 0.47.
[3]depth of each circular nanocavity.
[4]confinement.
[5]low refractive index layer.

Figure 7:
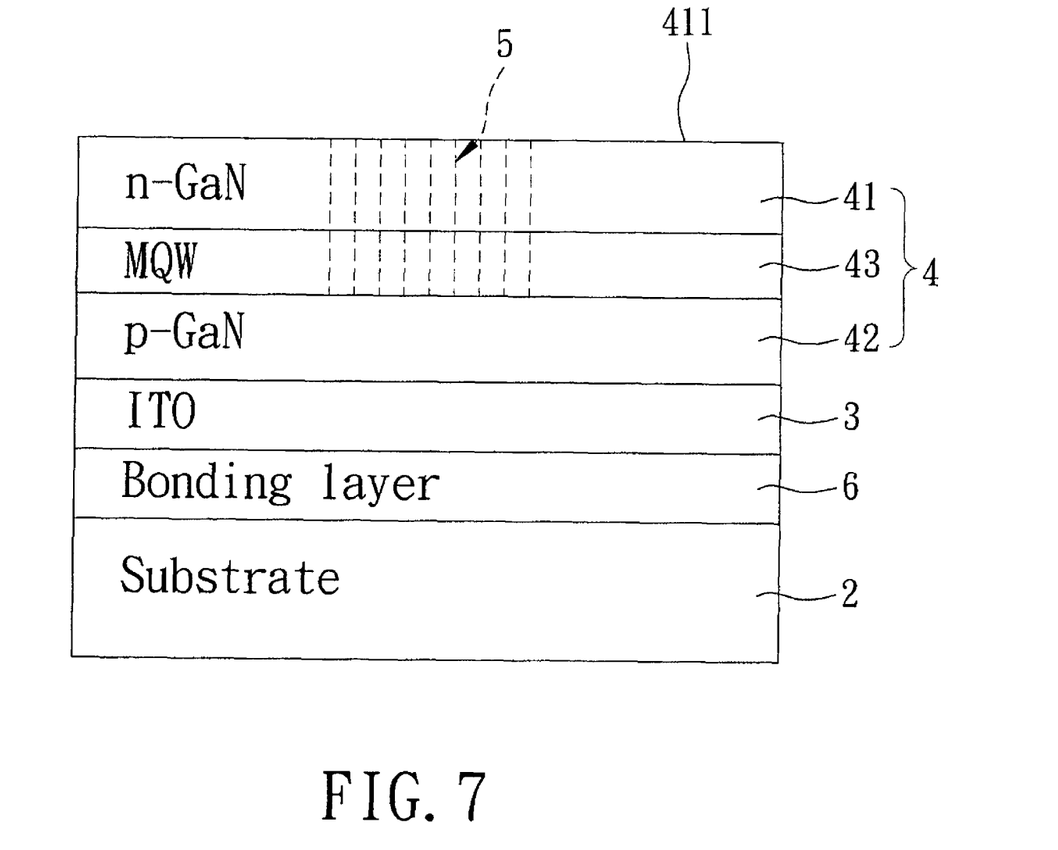
FIG. 7 is a schematic diagram of the third preferred embodiment of the surface-emitting laser (SEL) device according to this invention.

Referring to FIG. 7, the third preferred embodiment of the surface-emitting laser (SEL) device of this invention is similar to the second preferred embodiment, except that the low refractive index layer 3 is made from indium tin oxide (ITO) and has a layer thickness greater than 20 nm and not greater than 60 nm, and that formation of the low refractive index layer 3 on the substrate 2 is performed by wafer-bonding techniques through a bonding layer 6. The first and second semiconductor layer 41, 42 are made from the n-GaN and p-GaN, respectively. Since the material of the two-dimensional photonic crystal (2DPC) 5 is the same as that in the second embodiment, the normalized frequency ($a/\lambda_0$) used to design the following third example of the laser device is set at 0.47.

As shown in Table 3, the confinement of the third example is increased from 54.4% to 73.3% when the layer thickness of the low refractive index layer 3 is increased from 30 to 60 nm, and thus, the supply threshold voltage ($V_{th}$) can be reduced.

TABLE 3

| ITO[5] | | p-GaN/MQW/n-GaN[1] | | | | 2DPC[2] | | | | |
|---|---|---|---|---|---|---|---|---|---|---|
| | thickness | thickness (nm) | | | | r | a | | depth[3] | Conf.[4] |
| $n_L$ | (nm) | n | MQW | p | $n_H$ | (nm) | (nm) | r/a | (nm) | (%) |
| 1.9 | 30 | 200 | 100 | 240 | 2.5 | 70 | 210 | 0.333 | 340 | 54.42 |
| 1.9 | 40 | 200 | 100 | 240 | 2.5 | 70 | 210 | 0.333 | 340 | 57.81 |
| 1.9 | 45 | 200 | 100 | 240 | 2.5 | 70 | 210 | 0.333 | 340 | 62.68 |
| 1.9 | 50 | 200 | 100 | 240 | 2.5 | 70 | 210 | 0.333 | 340 | 64.15 |
| 1.9 | 60 | 200 | 100 | 240 | 2.5 | 70 | 210 | 0.333 | 340 | 73.22 |

[1]wavelength $\lambda_0$ of the light emitting layered structure is 450 nm.
[2]normalized frequency $a/\lambda_0$ of the 2DPC is about 0.47.
[3]depth of each circular nanocavity.
[4]confinement.
[5]low refractive index layer.

In conclusion, by forming the two-dimensional photonic crystal (2DPC) with the normalized frequency ranging from 0.3 to 0.7 in the light emitting layered structure and by providing the low refractive index layer between the substrate and the light emitting layered structure, the photons generated in the light emitting layered structure can be confined and resonated in the light emitting layered structure so as to be stimulated to generate the laser light, thereby eliminating the aforesaid drawback associated with the prior art.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A surface-emitting laser device comprising: a substrate; a low refractive index layer with a refractive index $n_L$ and disposed on said substrate; a light emitting layered structure with a refractive index $n_H$, where $n_H > n_L$, said light emitting layered structure being formed on said low refractive index layer and having first and second semiconductor layers and a multi-quantum well disposed between said first and second semiconductor layers and capable of generating photons having a wavelength $\lambda_0$; and a two-dimensional photonic crystal formed in said light emitting layered structure and having optical nanostructures arranged into a periodic pattern with a lattice constant a, said nanostructures extending from said first semiconductor layer through said multi-quantum well; wherein said two-dimensional photonic crystal has a normalized frequency, which is defined as $a/\lambda_0$, ranging from 0.25 to 0.70;

wherein said low refractive index layer is made from a III-V compound, silicon oxide, silicon nitride, or indium tin oxide, said light emitting layered structure being made from said III-V compound;

wherein said optical nanostructures are in the form of circular nanocavities, which are arranged into a honeycomb-shaped pattern;

wherein said light emitting layered structure is made from a GaN-based compound.

2. The surface-emitting laser device of claim 1, wherein said light emitting layered structure and said low refractive index layer are made from a GaAs-based compound, said lattice constant a of said periodic pattern ranging from 200 nm to 600 nm, each of said circular nanocavities having a radius r, where $0.11 < r/a < 0.45$.

3. The surface-emitting laser device of claim 2, wherein said normalized frequency of said two-dimensional photonic crystal ranges from 0.3 to 0.4.

4. The surface-emitting laser device of claim 3, wherein said low refractive index layer is made from $Al_{0.35}Ga_{0.65}As$, said low refractive index layer having a layer thickness ranging from 10 nm to 200 nm.

5. The surface-emitting laser device of claim 1, wherein said lattice constant a of said periodic pattern ranging from 190 nm to 300 nm, each of said circular nanocavities having a radius r, where $0.11 < r/a < 0.45$.

6. The surface-emitting laser device of claim 5, wherein said normalized frequency of said two-dimensional photonic crystal ranges from 0.4 to 0.5.

7. The surface-emitting laser device of claim 6, wherein said low refractive index layer is made from AlN, said low refractive index layer having a layer thickness greater than 20 nm and not greater than 100 nm.

8. The surface-emitting laser device of claim 6, wherein said low refractive index layer is made from indium tin oxide, said low refractive index layer having a layer thickness greater than 20 nm and not greater than 60 nm.

* * * * *